(12) United States Patent
Smith et al.

(10) Patent No.: US 11,094,643 B2
(45) Date of Patent: Aug. 17, 2021

(54) DETERMINING OVERLAY OF FEATURES OF A MEMORY ARRAY

(71) Applicant: Micron Technology, Inc., Boise, ID (US)

(72) Inventors: Kendall Smith, Meridian, ID (US); Kari McLaughlin, Boise, ID (US); Mario J. Di Cino, Boise, ID (US); Xue Chen, Boise, ID (US); Lane A. Gray, Boise, ID (US); Joseph G. Lindsey, Kuna, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 16/372,950

(22) Filed: Apr. 2, 2019

(65) Prior Publication Data

US 2020/0321283 A1 Oct. 8, 2020

(51) Int. Cl.
*H01L 23/544* (2006.01)
*H01L 21/768* (2006.01)
*H01L 21/027* (2006.01)
*H01L 23/528* (2006.01)
*H01L 21/3213* (2006.01)

(52) U.S. Cl.
CPC ........ *H01L 23/544* (2013.01); *H01L 21/0275* (2013.01); *H01L 21/32139* (2013.01); *H01L 21/76877* (2013.01); *H01L 23/528* (2013.01); *H01L 2223/54426* (2013.01)

(58) Field of Classification Search
None
See application file for complete search history.

(56) References Cited

U.S. PATENT DOCUMENTS

| | | | |
|---|---|---|---|
| 7,662,693 B2 | 2/2010 | Bhattacharyya | |
| 7,875,529 B2 | 1/2011 | Forbes et al. | |
| 8,274,777 B2 | 9/2012 | Kiehlbauch | |
| 2009/0116014 A1* | 5/2009 | Smith | G03F 7/705 356/401 |
| 2014/0264334 A1* | 9/2014 | Ning | H01L 21/02104 257/48 |
| 2015/0011022 A1* | 1/2015 | Lee | H01L 21/32139 438/5 |
| 2018/0175016 A1* | 6/2018 | Kim | G03F 7/70633 |
| 2019/0131190 A1* | 5/2019 | Chen | H01L 21/0337 |
| 2019/0148136 A1* | 5/2019 | Lee | H01L 23/528 257/759 |
| 2019/0384185 A1* | 12/2019 | Lo | G03F 9/7084 |

* cited by examiner

*Primary Examiner* — Benjamin P Sandvik
(74) *Attorney, Agent, or Firm* — Brooks, Cameron & Huebsch, PLLC

(57) ABSTRACT

Methods, apparatuses, and systems related to determining overlay of features of a memory array are described. An example method includes forming a plurality of contacts on a working surface and selectively forming a first portion of a layer of conductive lines and a second portion of the layer of conductive lines in contact with the contacts. The first portion of the layer of conductive lines formed over the working surface is separated from the second portion of the layer of conductive lines formed over the working surface by a gap. The method includes determining an overlay of at least one of the contacts formed over the working surface in the gap relative to one of the conductive lines formed over the working surface.

17 Claims, 14 Drawing Sheets

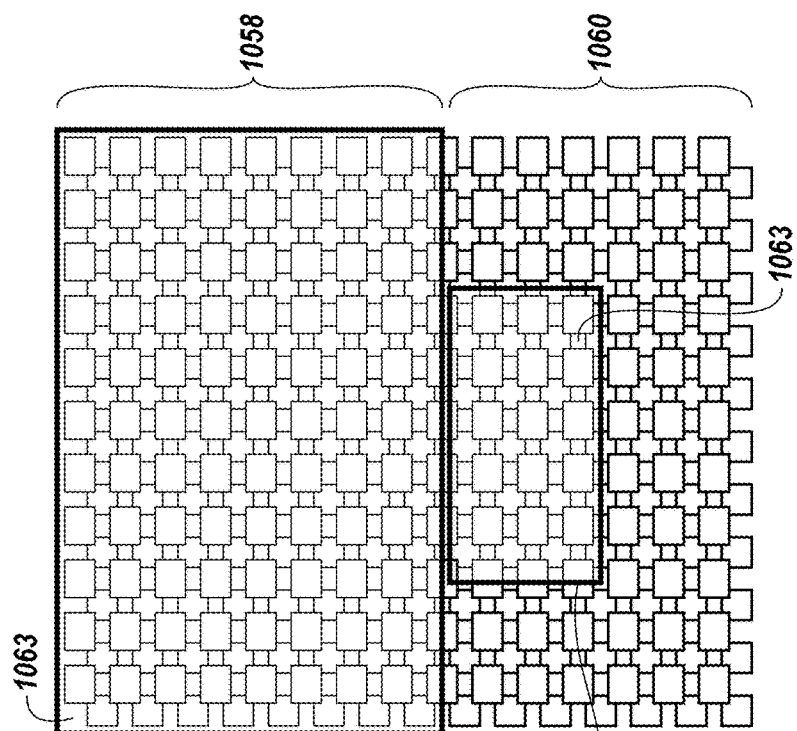
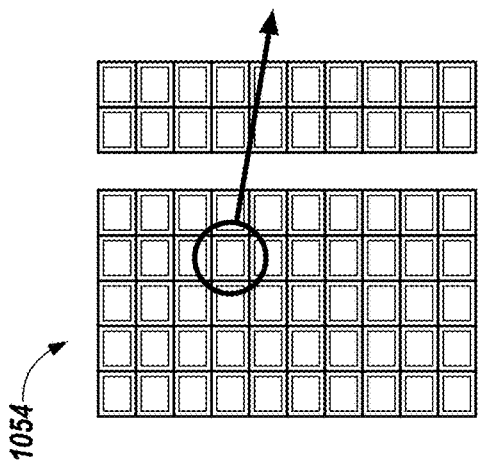

1280 →

```
┌─────────────────────────────────────────────────────────────┐
│     FORMING A PLURALITY OF CONTACTS ON A WORKING SURFACE     │ ← 1281
└─────────────────────────────────────────────────────────────┘
                              │
┌─────────────────────────────────────────────────────────────┐
│   SELECTIVELY FORMING A FIRST PORTION OF A LAYER OF CONDUCTIVE│
│    LINES AND A SECOND PORTION OF THE LAYER OF CONDUCTIVE LINES│
│   IN CONTACT WITH THE CONTACTS, WHEREIN THE FIRST PORTION OF  │ ← 1282
│  THE LAYER OF CONDUCTIVE LINES FORMED ON THE WORKING SURFACE IS│
│       SEPARATED FROM THE SECOND PORTION OF THE LAYER OF       │
│     CONDUCTIVE LINES FORMED ON THE WORKING SURFACE BY A GAP   │
└─────────────────────────────────────────────────────────────┘
                              │
┌─────────────────────────────────────────────────────────────┐
│    DETERMINING AN ALIGNMENT OF AT LEAST ONE OF THE CONTACTS   │
│     FORMED ON THE WORKING SURFACE IN THE GAP RELATIVE TO      │ ← 1283
│     ONE OF THE CONDUCTIVE LINES FORMED ON THE WORKING SURFACE │
└─────────────────────────────────────────────────────────────┘
```

```
┌─────────────────────────────────────────────────────────────┐
│   SELECTIVELY FORMING A FIRST PORTION OF A LAYER OF CONTACTS AND│
│   A SECOND PORTION OF THE LAYER OF CONTACTS ON A WORKING SURFACE,│
│   WHEREIN THE FIRST PORTION OF THE LAYER OF CONTACTS FORMED ON │ ← 1385
│    THE WORKING SURFACE IS SEPARATED FROM THE SECOND PORTION OF │
│      THE LAYER OF CONTACTS FORMED ON THE WORKING SURFACE BY A GAP│
└─────────────────────────────────────────────────────────────┘
                              │
┌─────────────────────────────────────────────────────────────┐
│  SELECTIVELY FORMING A FIRST PORTION OF A LAYER OF CONDUCTIVE LINES│
│       IN CONTACT WITH THE FIRST AND SECOND PORTIONS OF THE LAYER│ ← 1386
│    OF CONTACTS FORMED ON THE WORKING SURFACE AND A SECOND PORTION│
│       OF THE LAYER OF CONDUCTIVE LINES ON THE WORKING SURFACE │
└─────────────────────────────────────────────────────────────┘
                              │
┌─────────────────────────────────────────────────────────────┐
│  DETERMINING AN ALIGNMENT OF AT LEAST ONE OF THE CONDUCTIVE LINES│
│    FORMED ON THE WORKING SURFACE IN THE GAP RELATIVE TO ONE OF│ ← 1387
│           THE CONTACTS FORMED ON THE WORKING SURFACE          │
└─────────────────────────────────────────────────────────────┘
```

*Fig. 13*

DETERMINING OVERLAY OF FEATURES OF A MEMORY ARRAY

TECHNICAL FIELD

The present disclosure relates generally to semiconductor devices and methods, and more particularly to determining overlay of features of a memory array.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), static random access memory (SRAM), synchronous dynamic random access memory (SDRAM), ferroelectric random access memory (FeRAM), magnetic random access memory (MRAM), resistive random access memory (ReRAM), and flash memory, among others. Some types of memory devices may be non-volatile memory (e.g., ReRAM) and may be used for a wide range of electronic applications in need of high memory densities, high reliability, and low power consumption. Volatile memory cells (e.g., DRAM cells) require power to retain their stored data state (e.g., via a refresh process), as opposed to non-volatile memory cells (e.g., flash memory cells), which retain their stored state in the absence of power. However, various volatile memory cells, such as DRAM cells may be operated (e.g., programmed, read, erased, etc.) faster than various non-volatile memory cells, such as flash memory cells.

BRIEF DESCRIPTION OF THE DRAWINGS

FIGS. 10A-10C illustrate plan views of a plurality of contacts formed external to a memory array in accordance with a number of embodiments of the present disclosure.

FIGS. 12-15 are flow diagrams of example methods for determining overlay of features of a memory array in accordance with a number of embodiments of the present disclosure.

DETAILED DESCRIPTION

Figure 1:
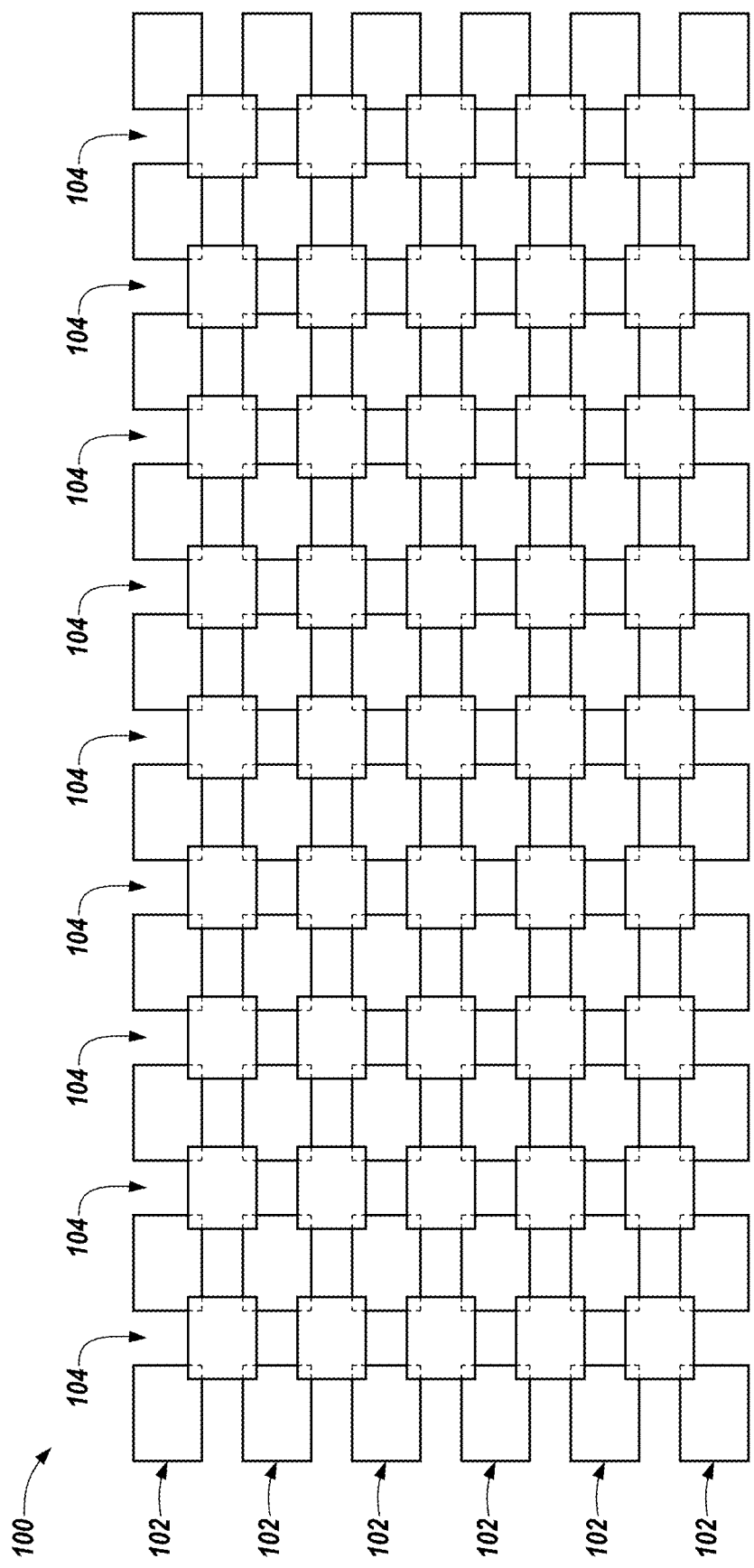
FIG. 1 illustrates a plan view of a layer of contacts in accordance with a number of embodiments of the present disclosure.

Various types of memory devices, including arrays of volatile and/or non-volatile memory cells (e.g., a memory array), can include a plurality of contacts and a plurality of lines to which the memory cells can be coupled. The lines of a memory array can be formed in contact with the contacts. In at least one embodiment of the present disclosure, the lines of a memory array can be conductive lines. In some previous approaches, during fabrication of a memory device, a die (e.g., a wafer) may include a scribe target. A scribe target may include overlay targets and structures and/or engineering marks that may be used to determine where a pattern is on a wafer. The scribe target may be removed from the die such that a finished memory device does not include the scribe target on the die. As used herein, "overlay" refers to an offset between two or more patterns (e.g., photolithographic patterns) after placement of the patterns. During fabrication of a memory device, a scribe target may be used to determine the overlay (e.g., offset) of a first feature (e.g., a contact) relative to a second feature (e.g., a conductive line). For example, a scribe target may be used to determine whether contacts of a memory array are in line with conductive lines of the memory array. However, as the pitch of a memory array decreases, the size of the contacts also decrease. As used herein, "pitch" refers to the distance between two adjacent conductive lines a memory array. The size of the contacts are reduced so that two corresponding conductive line (and two adjacent memory cells) to be formed closer together. In some examples, the size of the contacts is reduced so much that the width of a contact is less than the width of a conducive line formed in contact with the contact. Thus, an overlay of a contact with another feature (e.g., a conductive line formed in contact with the contact) can be obstructed and/or obscured by the other feature.

To form features of a memory array, such as contacts and conductive lines, a mask material (e.g., a photoresist material) can be applied to a feature layer to selectively transfer a pattern to a wafer. That is, the mask material can be used to control where a pattern is transferred to a wafer and which portion or portions of a pattern are transferred to a wafer. A mask material can also be referred to as a chop mask herein. A pattern can extend beyond a region of a wafer associated with operation the memory array to reduce impacts from pattern termination such as loop ends, OPC, and etch loading effects. A mask material can be used to remove excess pattern (pattern that extends beyond the region of a wafer associated with operation the memory array). Removal of the excess pattern can be achieved using a photolithography technology (e.g., including krypton fluoride (KrF) or argon fluoride (ArF) excimer lasers) to form a mask material over the excess pattern.

To overcome difficulties associated with previous approaches to determining the overlay of features of a memory array, embodiments in accordance with the present disclosure utilize a mask material to selectively transfer a portion of a pattern (e.g., a feature layer) to a wafer that can serve as reference features.

The present disclosure includes methods, apparatuses, and systems related to determining overlay of features of a memory array. An example of a method described herein includes introducing, forming a plurality of contacts on a working surface and selectively forming a first portion of a layer of conductive lines and a second portion of the layer of conductive lines in contact with the contacts. The first portion of the layer of conductive lines formed over the working surface is separated from the second portion of the layer of conductive lines formed over the working surface by a gap. The example method further includes determining an overlay of at least one of the contacts formed over the working surface in the gap relative to one of the conductive lines formed over the working surface.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, "a number of" something can refer to one or more such things. For example, a number of capacitors can refer to at least one capacitor.

The figures herein follow a numbering convention in which the first digit or digits correspond to the figure number of the drawing and the remaining digits identify an element or component in the drawing. Similar elements or components between different figures may be identified by the use of similar digits. For example, reference numeral 104 may reference element "04" in FIG. 1, and a similar element may be referenced as 204 in FIG. 2.

FIG. 1 illustrates a plan view of a layer of contacts 100 in accordance with a number of embodiments of the present disclosure. The layer of contacts 100 can be a first feature layer. The layer of contacts 100 can include a first plurality of contacts 102 and a second plurality of contacts 104. As illustrated in FIG. 1, the second plurality of contacts 104 can overlap the first plurality of contacts (e.g., at the corners of the contacts). However, embodiments of the present disclosure are not so limited. Although FIG. 1 illustrates the layer of contacts 100 as including contacts in a rectangular arrangement, embodiments of the present disclosure are not so limited. While contacts may initially be rectangular as illustrated in the layer of contacts 100, the shape of the contacts can be altered during photolithography. For example, the shape of contacts of the layer of contacts 100 can be round or oval after applying a chop mask to the layer of contacts 100. The contacts of the layer 100 can be in a non-rectangular arrangement, such as a hexagonal arrangement.

Figure 2:
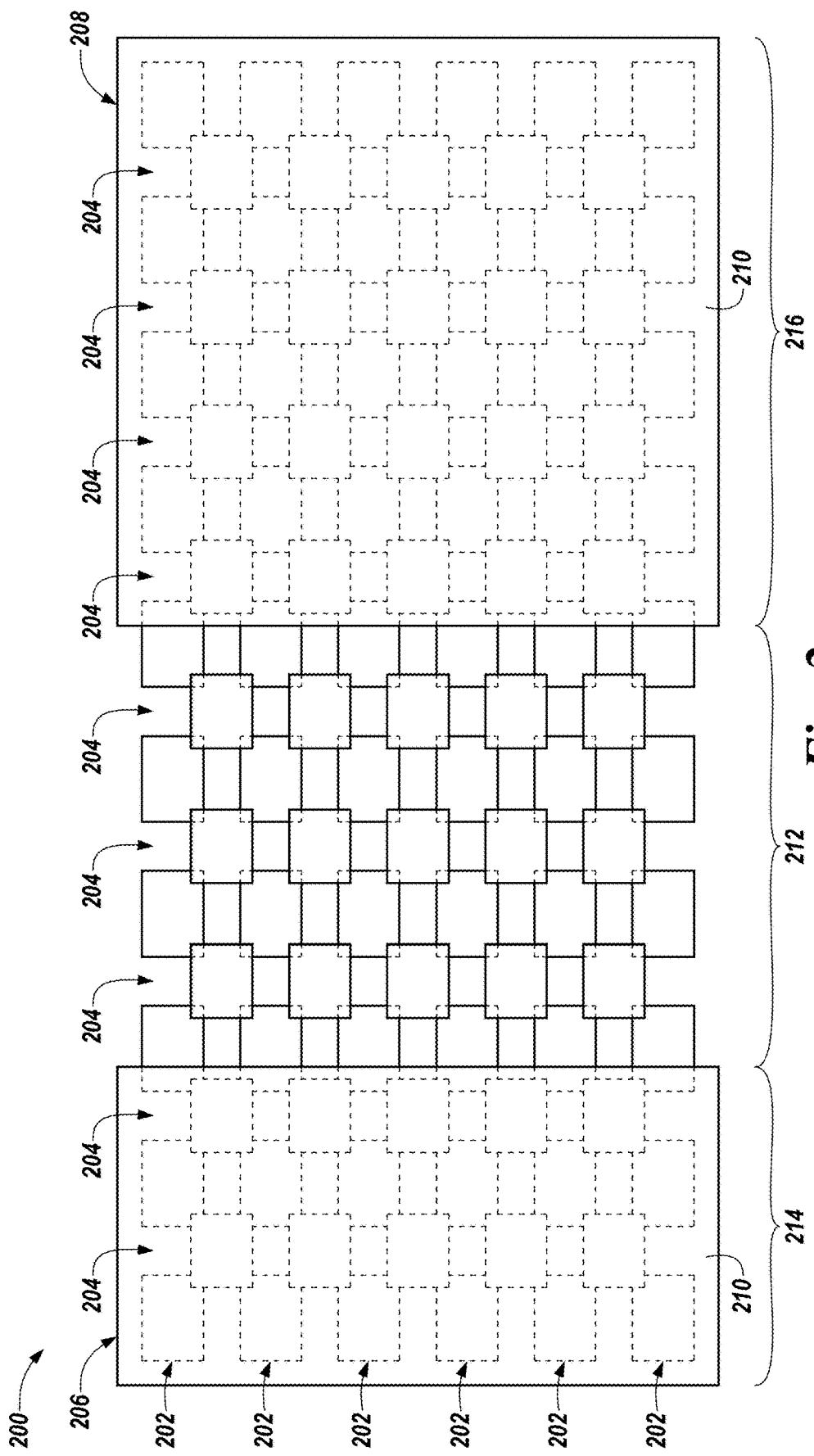
FIG. 2 illustrates a plan view of a chop mask applied to the layer of contacts of FIG. 1 in accordance with a number of embodiments of the present disclosure.

FIG. 2 illustrates a plan view of a chop mask 210 applied to the layer of contacts 200 in accordance with a number of embodiments of the present disclosure. The chop mask 210 can be used to selectively form (e.g., transfer) a portion or portions of the layer of contacts 200 to a working surface (not illustrated in FIG. 2). In at least one embodiment, the working surface can be a wafer (e.g., a silicon wafer). As illustrated in FIG. 2, the chop mask 210 can be applied to the layer of contacts 200 to selectively form, on the working surface, a subset of the contacts 202 and 204 (dashed) in contact with the chop mask 210. A first portion 206 of the chop mask 210 can be used to form a first portion 214 of the layer of contacts 200 on the working surface and a second portion 208 of the chop mask 210 can be used to form a second portion 216 of the layer of contacts 200 on the working surface. As illustrated in FIG. 2, there can be a gap 212 between the first portion 206 of the chop mask 210 and the second portion 208 such that a third portion of the layer of contacts 200 in between the first and second portions 206 and 208 of the chop mask 210 is not formed to the working surface.

Figure 3:
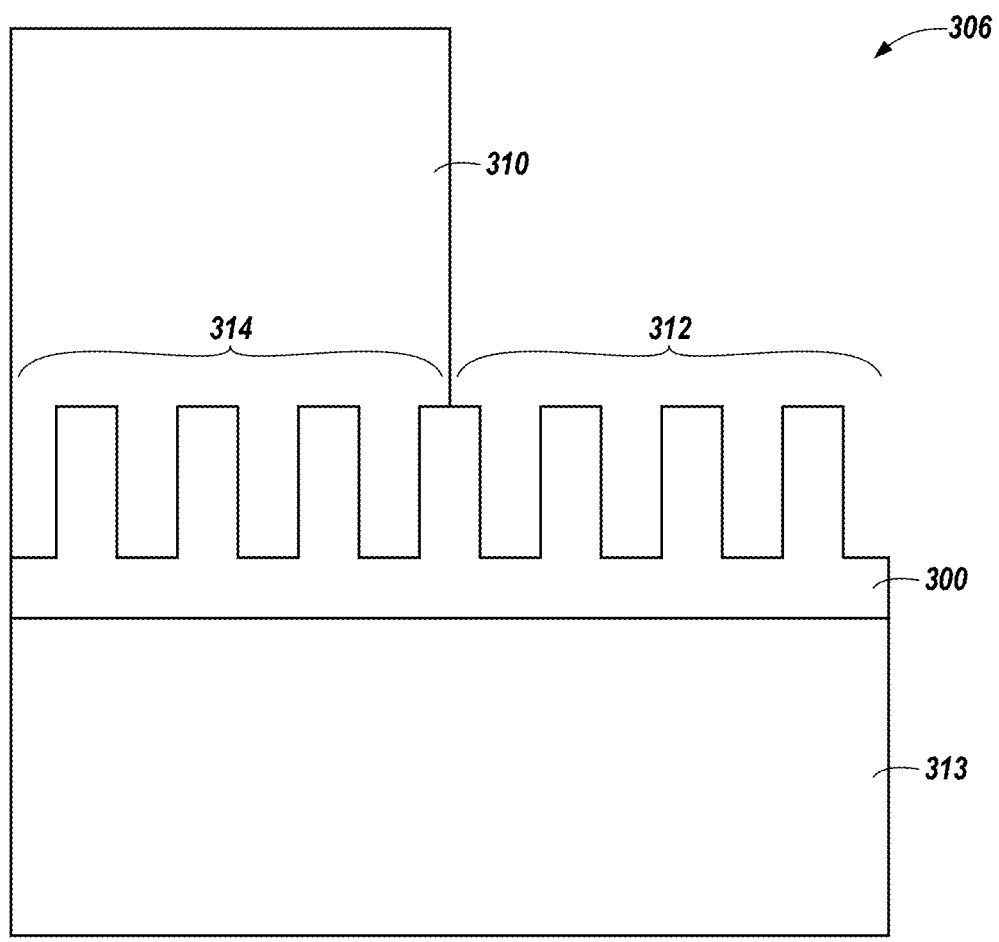
FIG. 3 illustrates a cross-sectional view of application of a chop mask on the layer of contacts of FIG. 1 in accordance with a number of embodiments of the present disclosure.

FIG. 3 illustrates a cross-sectional view of application of a chop mask 310 on contracts of the layer of contacts 300. FIG. 3 shows the first portion 306 of the chop mask 310, the first portion 314 of the layer of contacts 300, and the gap 312. The chop mask 310 can be a photoresist material. The first portion of the chop mask 310 can cause the first portion 314 of the layer of contacts 300 formed on the working surface 313 in response to being exposed to an excimer laser. In contrast, the portion of the layer of contacts 300 in the gap 312 to which the chop mask 310 is not applied will not be formed on the working surface 313.

Although not specifically illustrated, application of the chop mask 310 to the layer of contacts 300 shown in FIG. 3 can be similar to application of the chop mask 626 to the layer of conductive lines 620 described in association with FIG. 6 below. Although the layer of contacts 300 can be formed by pitch doubling, embodiments of the present disclosure are not so limited. The layer of contacts 300 can be formed by any pitch multiplication with contacts formed at intersections of spaces between lines, such as lines of the layer of lines 520 described in association with FIG. 5 below.

Figure 4:
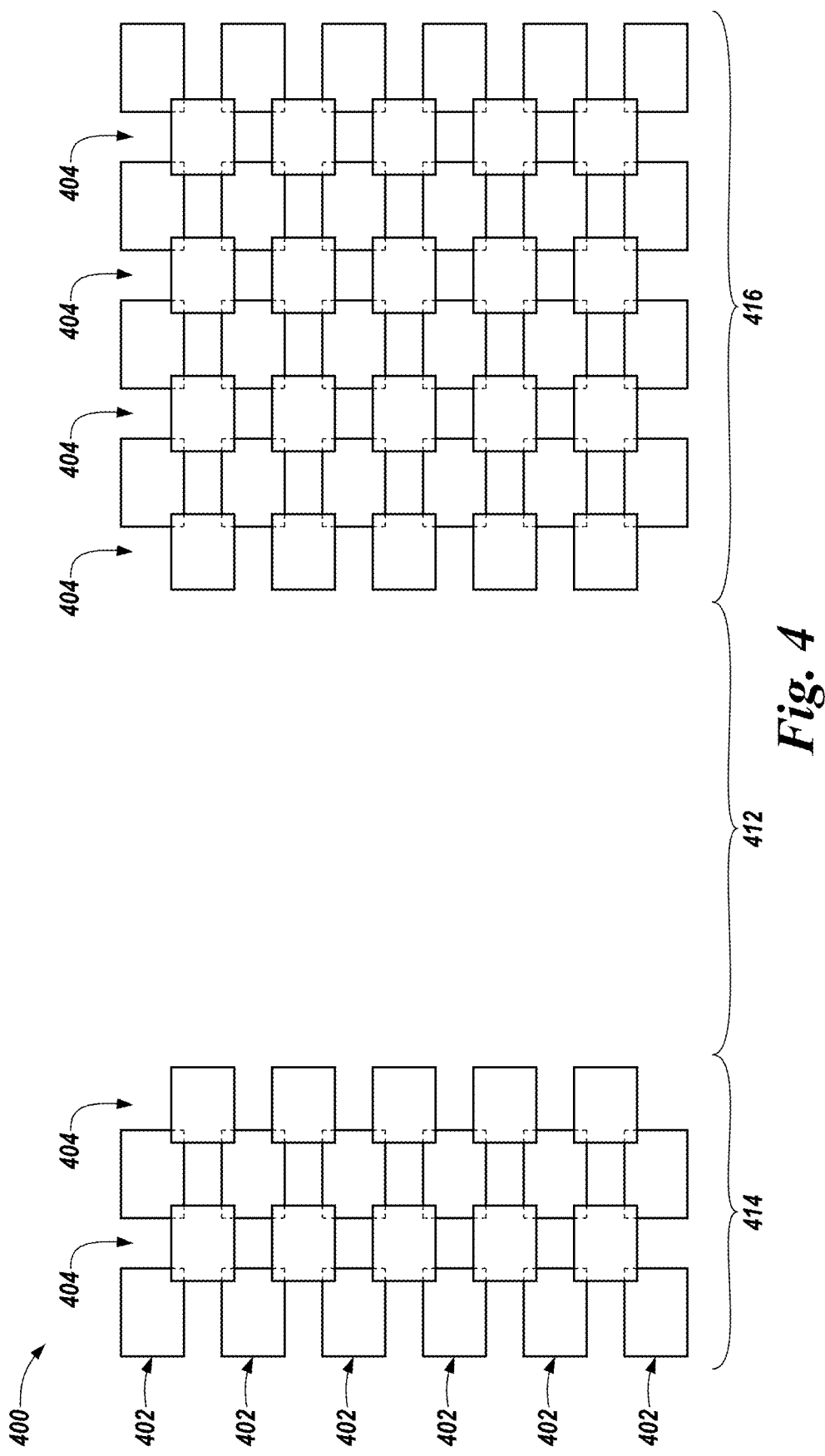
FIG. 4 illustrates a plan view of portions of the layer of contacts of FIG. 1 formed over a working surface in accordance with a number of embodiments of the present disclosure.

FIG. 4 illustrates a plan view of portions of the layer of contacts formed over a working surface in accordance with a number of embodiments of the present disclosure. The first portion 414 of the layer of contacts formed over the working surface and the second portion 416 of the layer of contacts formed over the working surface are separated by the gap 412.

Figure 5:
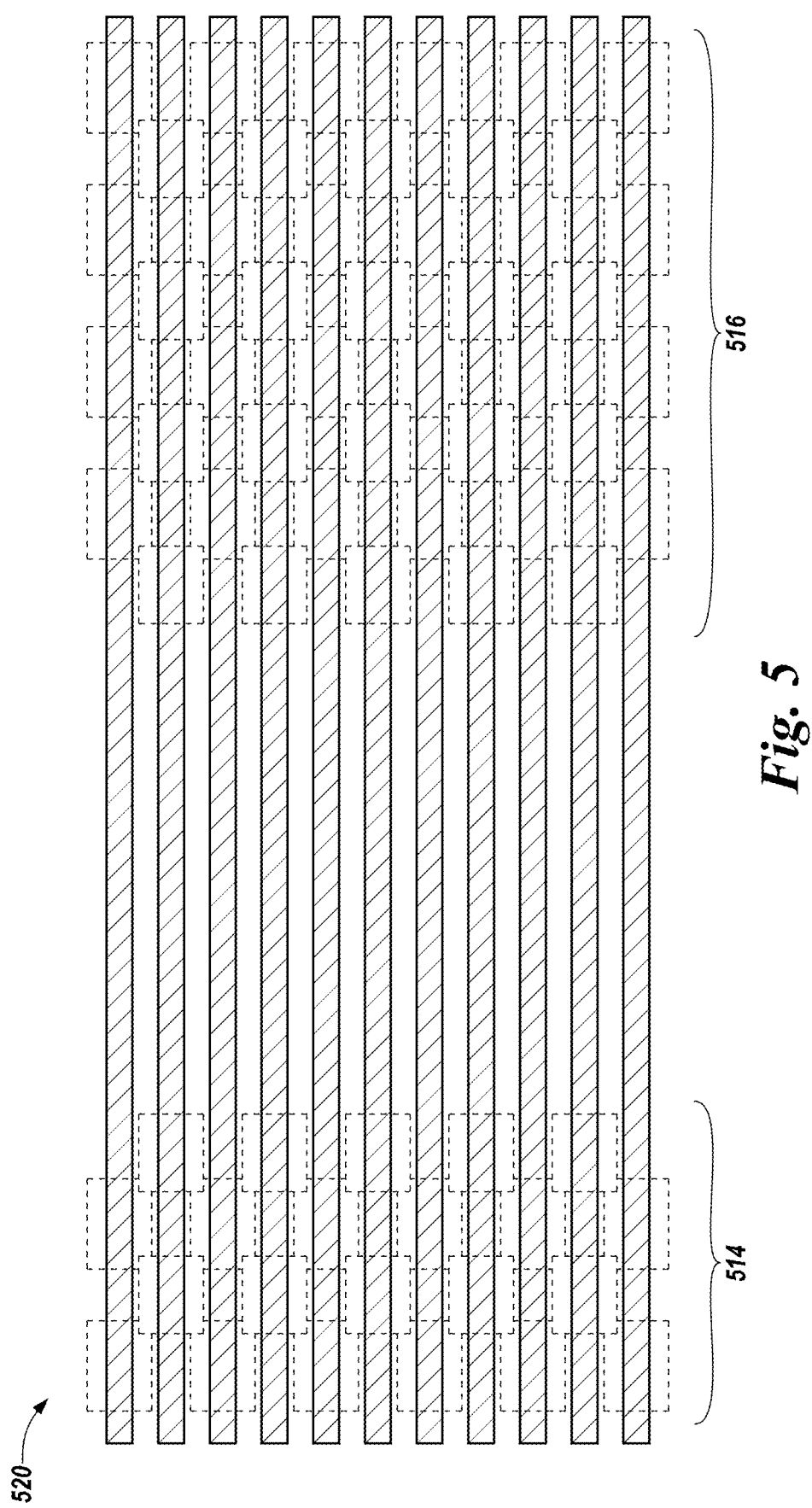
FIG. 5 illustrates a plan view of a layer of conductive lines in accordance with a number of embodiments of the present disclosure.

FIG. 5 illustrates a layer of conductive lines 520 in accordance with a number of embodiments of the present disclosure. The layer of conductive lines 520 can be a second feature layer. In at least one embodiment, a layer of lines can be used in place of the layer of conductive lines 520 where at least one line of the layer of lines is non-conductive. The layer of conductive lines 520 can be referred to as the line space layer 520. The layer of conductive lines 520 includes a plurality of conductive lines arranged horizontally. However, embodiments of the present disclosure are not so limited. For example, the plurality of conductive lines can be arranged vertically or diagonally. The first and second portions 514 and 516 of the layer of contacts formed over the working surface is shown as dashed to indicate that the first and second portions 514 and 516 can be underneath the layer of conductive lines 520.

Figure 6:
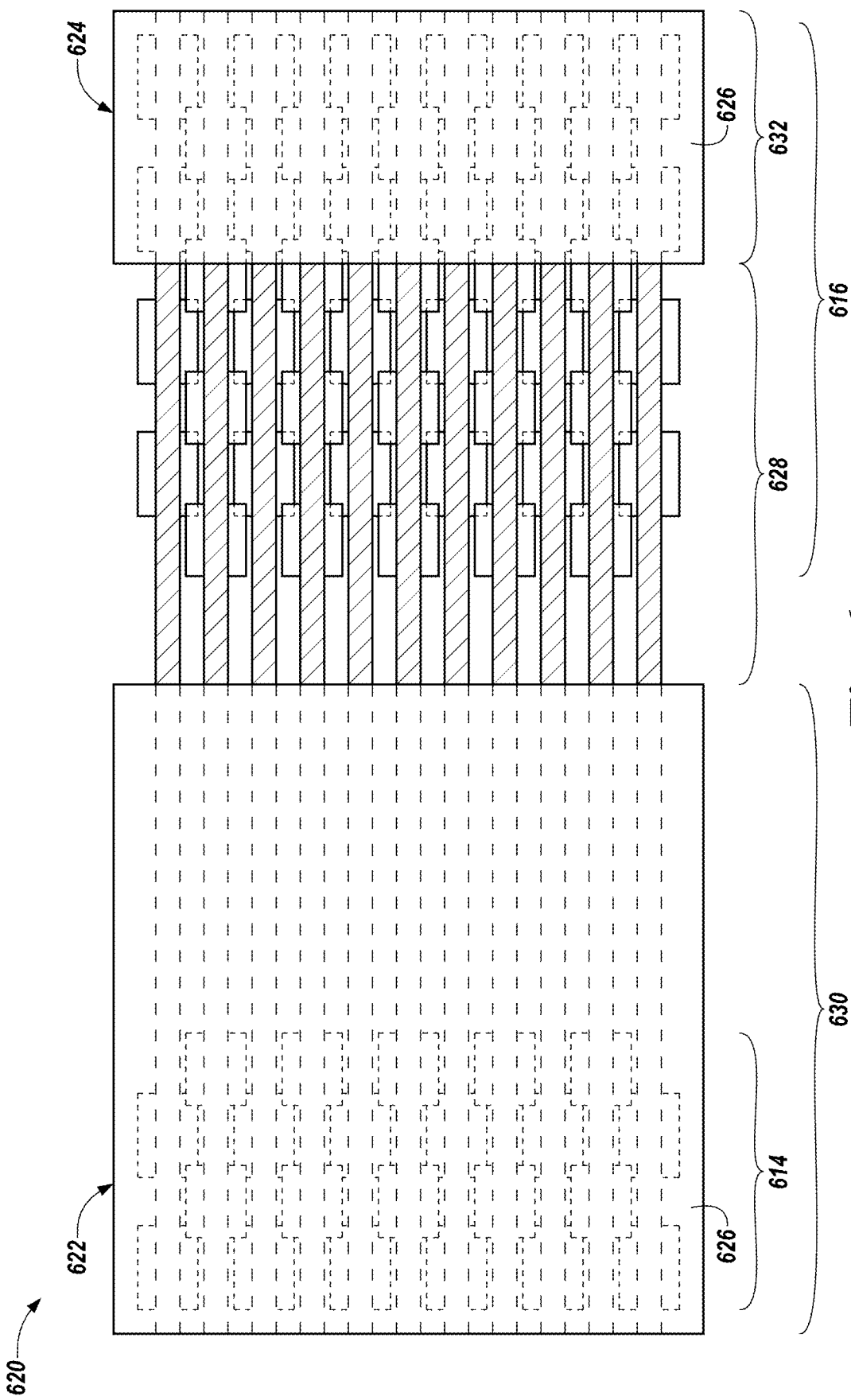
FIG. 6 illustrates a plan view of a chop mask applied to the layer of conductive lines of FIG. 4 in accordance with a number of embodiments of the present disclosure.

FIG. 6 illustrates a chop mask 626 applied to the layer of conductive lines 620 in accordance with a number of embodiments of the present disclosure. In at least one embodiment, the chop mask 626 can be the same mask material as the chop mask 210 illustrated in FIG. 2. The first and second portions 614 and 616 of the layer of contacts 620 formed over the working surface is shown as dashed to indicate that the first and second portions 614 and 616 can be underneath the layer of conductive lines 620.

The chop mask 626 can be used to selectively form (e.g., transfer) a portion or portions of the layer of conductive lines 620 to the working surface. As illustrated in FIG. 6, the chop mask 626 can be applied to the layer of conductive lines 620 to selectively form, on the working surface, a subset of the conductive lines (dashed) in contact with the chop mask 626. A first portion 622 of the chop mask 626 can be used to form a first portion 630 of the layer of conductive lines 620 on the working surface and a second portion 624 of the chop mask 626 can be used to form a second portion 632 of the layer of conductive lines 620 on the working surface. As illustrated in FIG. 6, there can be a gap 628 between the first portion 622 of the chop mask 626 and the second portion 624 of the chop mask 626 such that a third portion of the layer of conductive lines 620 between the first and second portions 622 and 624 of the chop mask 626 is not formed over the working surface.

Figure 7:
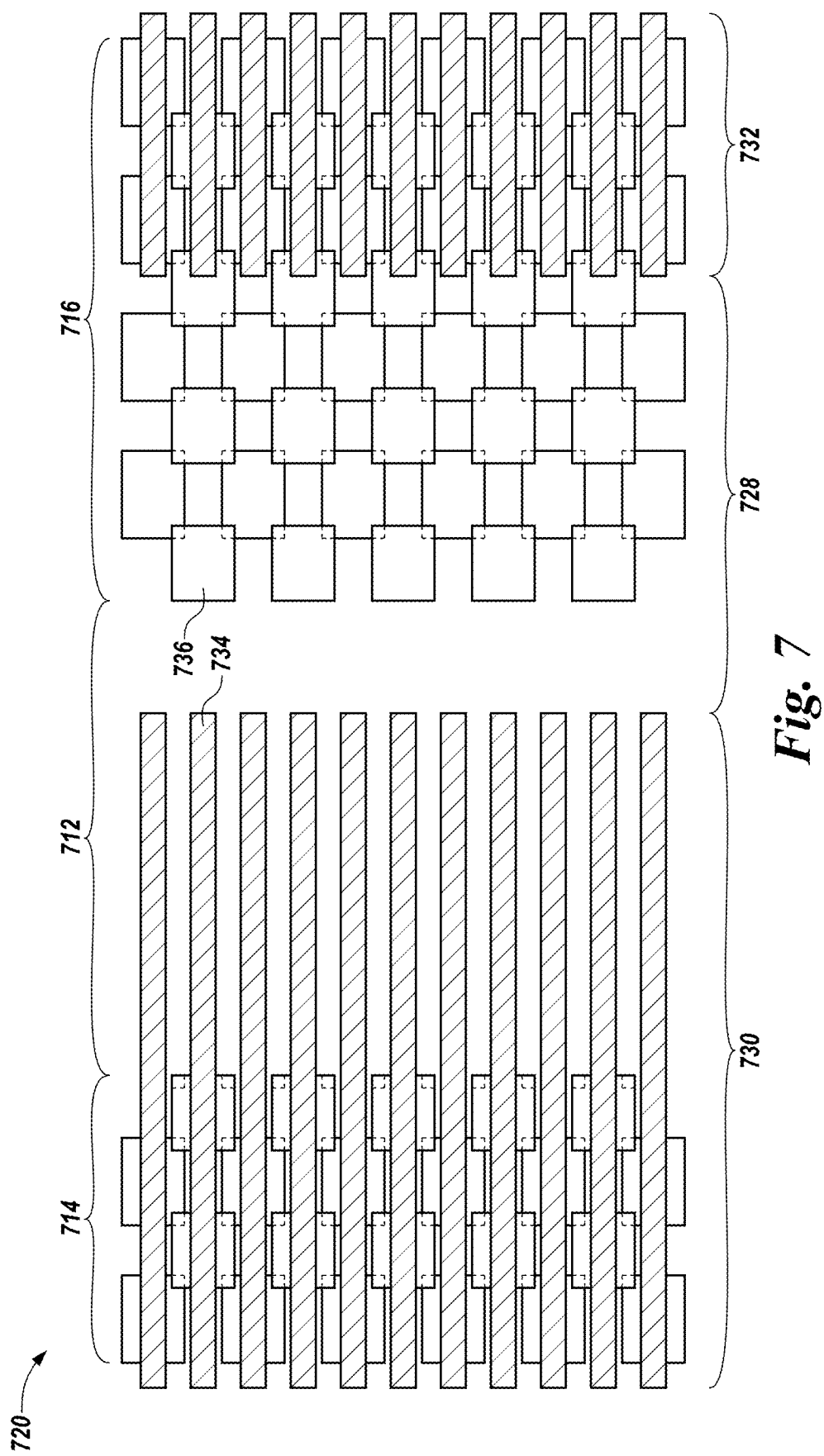
FIG. 7 illustrates a plan view of portions of the layer of conductive lines of FIG. 4 formed in accordance with a number of embodiments of the present disclosure.

FIG. 7 illustrates portions of the layer of conductive lines formed in accordance with a number of embodiments of the present disclosure. The first portion 730 of the layer of conductive lines can be formed over the working surface and the first portion 714 of the layer of contacts. The second portion 732 of the layer of conductive lines can be formed over the working surface and the second portion 716 of the layer of contacts. The first and second portions 730 and 732 of the layer of conductive lines are separated by the gap 728.

The gap 712 between the first and second portions of the layer of contacts can partially overlap the gap 728 between the first and second portions 730 and 732 of the layer of conductive lines. Thus, as illustrated in FIG. 7, a part of the first portion 730 of the layer of conductive lines is formed over the working surface and not in contact with the first portion 714 of the layer of contacts, and a part of the second portion 716 of the layer of contacts is formed over the working surface and not in contact with the second portion 732 of the layer of conductive lines. This allows more unobstructed overlay of the part of the first portion 730 of the layer of conductive lines and the part of the second portion 716 of the layer of contacts than some previous approaches.

Some previous approaches may include determining the overlay of a conductive line relative to a contact on which the conductive line is formed. As described above, the contacts may be obstructed or obscured by the conductive lines such that determining an offset a conductive line relative to a contact on which the conductive line is formed is difficult, if not impossible. In contrast, embodiments of the present disclosure can utilize the more unobstructed overlay of the part of the first portion 730 of the layer of conductive lines formed in the gap 728 and the part of the second portion 716 of the layer of contacts formed in the gap 712 to determine the overlay of the first and second portions 730 and 732 of the layer of conductive lines relative to the first and second portions 712 and 714 of the layer of contacts. For example, the offset of the conductive line 734 relative to the contact 736 can be determined. For instance, whether the conductive line 734 is inline with the contact 736 can be determined.

Figure 8:
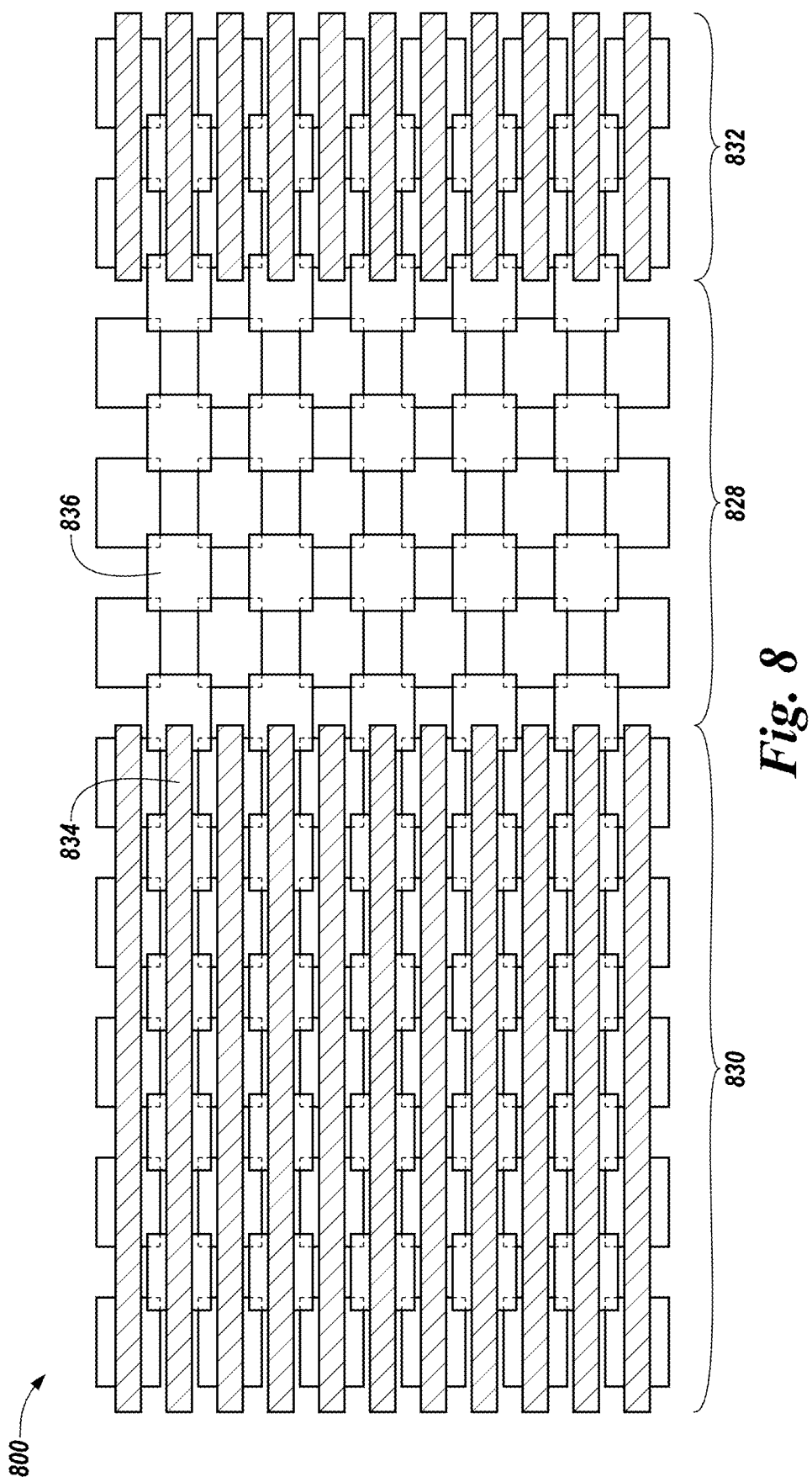
FIG. 8 illustrates a plan view of portions of the layer of conductive lines of FIG. 4 formed over the layer of contacts of FIG. 1 in accordance with a number of embodiments of the present disclosure.

FIG. 8 illustrates portions of the layer of conductive lines formed over the layer of contacts in accordance with a number of embodiments of the present disclosure. In at least one embodiment, a mask material, such as the chop mask 626 illustrated in FIG. 6, can be used to form a first portion 830 of the layer of conductive lines and a second portion 832 of the layer of conductive lines on an uninterrupted layer of contacts. Such an embodiment provides a less unobstructed view of the contacts formed over the working surface within the gap 828. For instance, if the size of the contacts is slightly greater than the width of the conductive lines, then providing a more unobstructed overlay of a portion of the contacts can facilitate determining the overlay of the first and second portions 830 and 832 of the layer of conductive lines relative to the layer of contacts.

Figure 9:
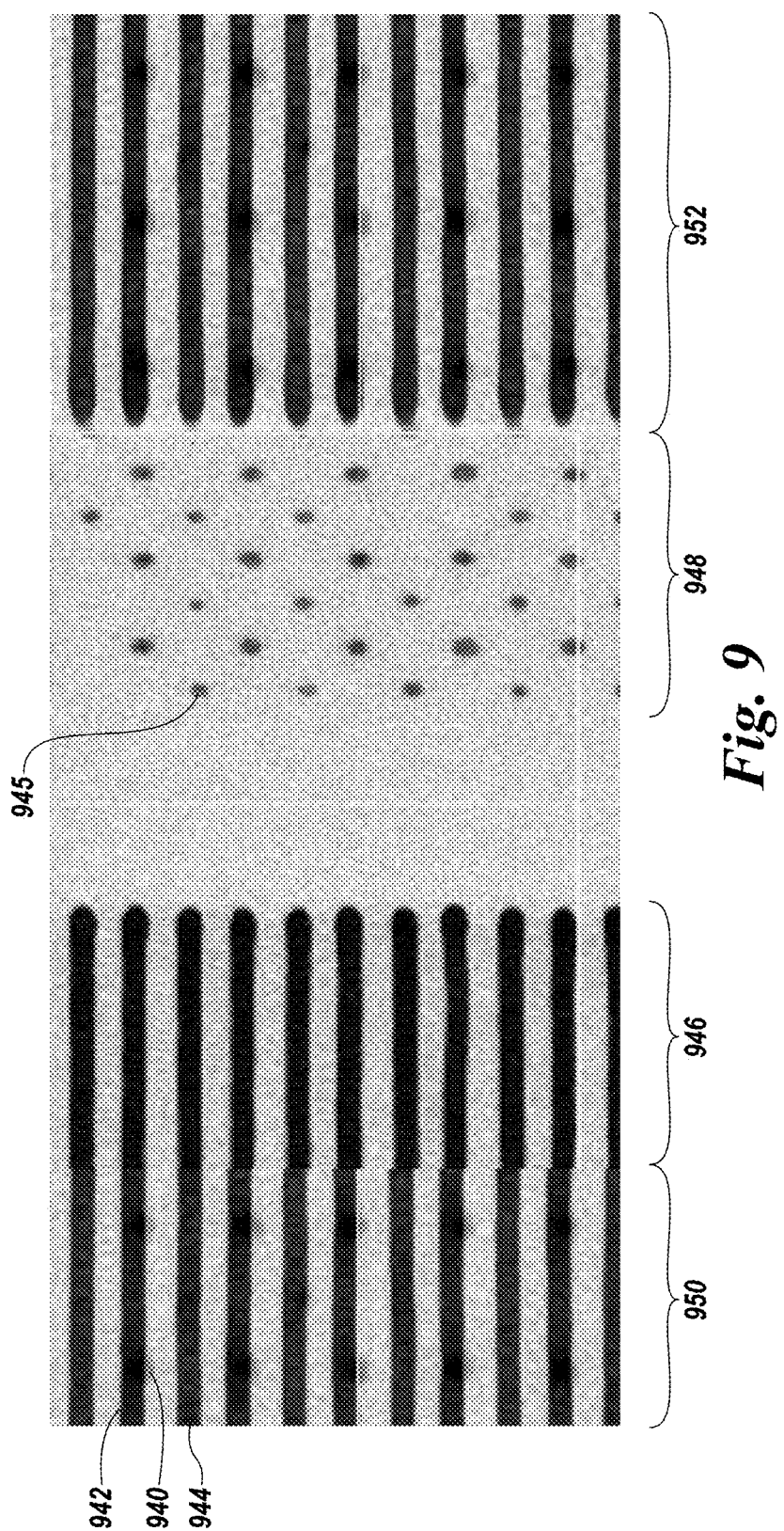
FIG. 9 illustrates a plan view of a plurality of conductive lines and a plurality of contacts formed in accordance with a number of embodiments of the present disclosure.

FIG. 9 illustrates a plurality of conductive lines and a plurality of contacts formed in accordance with a number of embodiments of the present disclosure. In FIG. 9, the round dots are contacts on a working surface (e.g., a wafer) formed from a first feature layer (e.g., the layer of contacts 100 illustrated in FIG. 1) and the horizontal lines are conductive lines formed over the working surface and the contacts from a second feature layer (e.g., the layer of conductive lines 520 illustrated in FIG. 5).

FIG. 9 illustrates a first portion 950 of a working surface in which conductive lines are formed in contact with contacts, a second portion 946 of the working surface in which conductive lines are formed over the working surface and not on the contacts, a third portion 948 of the working surface in which contacts are formed over the working surface but conductive lines are not formed over the contacts, and a fourth portion 952 of the working surface in which conductive lines are formed in contact with contacts. The arrangement of the contacts and conductive lines illustrated in FIG. 9 can be analogous to the arrangement of the contacts and conductive lines illustrated in FIG. 7.

As illustrated in FIG. 9, in the first and fourth portions 950 of the working surface it can be difficult to distinguish the contacts from the conductive lines. For example, in the first portion 950 of the working surface, the contact 940 can be distinguished from the conductive line 942, which is formed in contact with the contact 940. Thus, it may be possible to determine an offset of the contact 940 from the conductive line 942. However, the conductive line 944 obscures and hides the contacts on which the conductive line 944 is formed. As such, it is difficult, if not impossible, to determine an offset between the conductive line 944 and a contact on which the conductive line 944 is formed.

In contrast, forming the contacts as described in association with FIGS. 1-4 above and the conductive lines as described in association with FIGS. 5-7 above can provide an improved (e.g., more unobstructed) overlay of the conductive lines in the second portion 946 of the working surface and the contacts in the third portion 948 of the working surface. For example, to determine an offset between the conductive line 944 and a contact on which the conductive line 944 is formed, a contact in the third portion 948 of the working surface (e.g., the contact 945) can be used. The offset between the contact 945 and the conductive line 944 in the second portion 946 of the working surface can be indicative of an offset between the conductive line 944 and contacts on which the conductive line 944 is formed.

FIG. 10A-10C illustrate a plurality of contacts formed external to a memory array 1056 in accordance with a number of embodiments of the present disclosure. FIG. 10A illustrates a memory device 1054 including a plurality of memory arrays. FIG. 10B illustrates an enlarged view of a memory array 1056 of the memory device 1054. The inner rectangle 1055 represents an active region of the memory array 1056. As used herein, "active region of a memory array" refers to a portion of the memory array including features, such as contacts and/or conductive lines, that are active during operation of the memory array 1056. In contrast, the outer rectangle 1057 represents the external boundary of the memory array 1056. Features, such as contacts and/or conductive lines, formed within the external boundary of the memory array 1056 but external to the active region of the memory array are inactive during operation of the memory array 1056.

FIG. 10C illustrates an enlarged view of a portion of the memory array 1056. As described in association with FIG. 2 above, a chop mask can be used to selectively form a portion of a feature layer (e.g., a layer of contacts) to a working surface. FIG. 10 illustrates a layer of contacts 1065 including a first portion 1058 and a second portion 1060. The layer of contacts 1065 can be analogous to the layer of contacts 200 illustrated in FIG. 2. The first portion 1058 of the layer of contacts 1065 can be positioned over a portion of a working surface corresponding to the active region of the memory array 1056. A first portion 1062 of a chop mask 1063 can be applied to the first portion 1058 of the layer of contacts 1065 to form the contacts of the active region of the memory array 1056.

The second portion 1060 of the layer of contacts 1065 can be positioned over a different portion of the working surface that is external to the active region of the memory array 1056. In some previous approaches, no features may be formed external to an active region of a memory array. In contrast, at least one embodiment can include using a chop mask to form features on a portion of a working surface that is external to an active region of a memory array. As illustrated in FIG. 10, a second portion 1064 of the chop mask 1063 can be applied to at least a portion of the second portion 1060 of the layer of contacts 1065 to form contacts on a portion of the working surface that is external to the active region of the memory array 1056. The second portion 1064 of the chop mask 1063 can be thought of as an extension of the first portion 1062 of the chop mask 1063. Thus, the second portion 1064 of the chop mask 1063 can extend formation of contacts of the layer of contacts 1065 beyond the active region of the memory array 1056. The contacts formed external to the active region of the memory array 1056 can be referred to as reference contacts.

Forming contacts external to an active region of a memory array can provide a more unobstructed overlay of the contacts formed external to the active region of the memory array 1056 because other features (e.g., conductive lines) are not formed over the contacts formed external to the active region of the memory array 1056. One or more of the contacts formed external to the active region of the memory array 1056 can be used to determine the overlay of another feature (e.g., a conductive line) formed in the active region of the memory array 1056 relative to the contacts formed external to the active region of the memory array 1056. This can be beneficial, for instance, when contacts of an active region of a memory array is obstructed or obscured by the conductive lines of the active region such that determining an offset of a conductive line of the active region relative to a contact of the active region is difficult, if not impossible. Overlay of a reference contact relative to a conductive line of the active region of the memory array 1056 can be indicative of the overlay of a contact of the active region of the memory array 1056 relative to a conductive line of the active region of the memory array 1056.

FIGS. 11A-11E illustrate example processing steps for pitch multiplication in accordance with a number of embodiments of the present disclosure. The processing steps shown in FIGS. 11A-11E can be used to form the layer of contacts 200 illustrated in FIG. 2 and/or the layer of conductive lines 520 illustrated in FIG. 5.

Figure 11A:
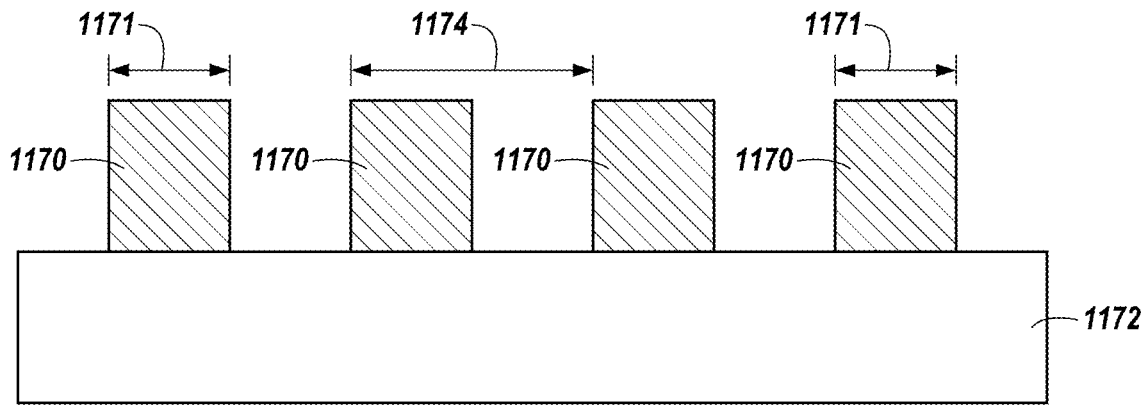
FIGS. 11A-11E illustrate example processing steps for pitch multiplication in accordance with a number of embodiments of the present disclosure.

FIG. 11A illustrates a photoresist material 1170 formed over a substrate material 1172. The photoresist material 1170 has a first width 1171. Each instance of the photoresist material 1170 is separated from another instance of the photoresist material 1170 by a first distance (e.g., a first pitch) 1174.

Figure 11B:
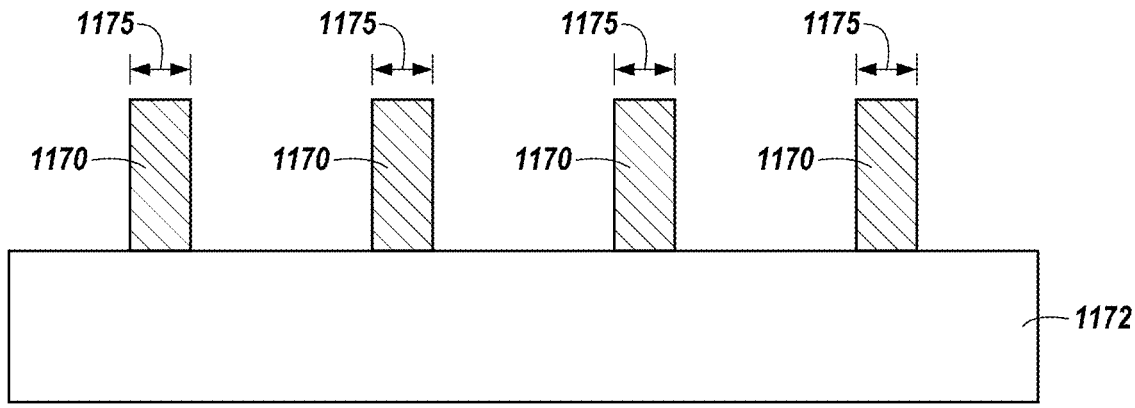

FIG. 11B illustrates the photoresist material 1170 after a subsequent processing step in which the photoresist material 1170 is trimmed from the first width 1171 to a second width 1175.

Figure 11C:
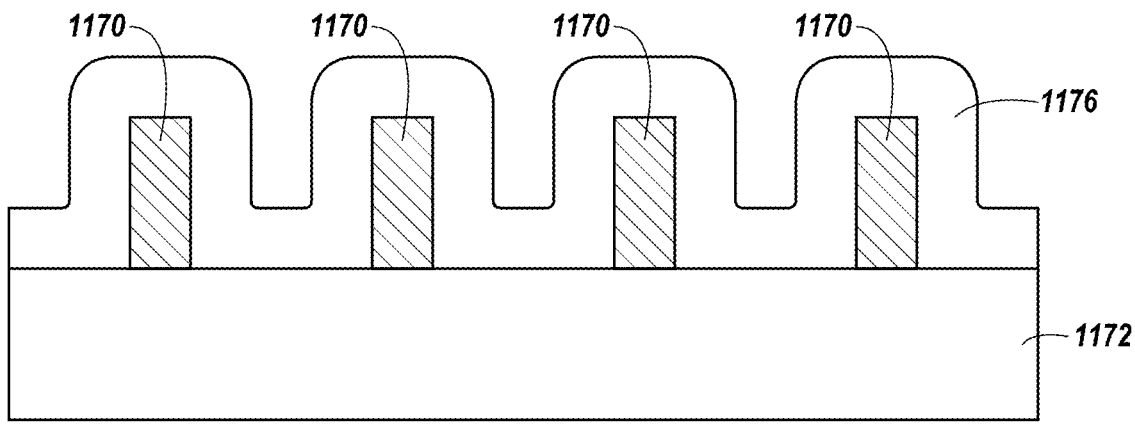

FIG. 11C illustrates the trimmed photoresist material 1170 after a subsequent processing step in which a spacer material 1176 is formed (e.g., deposited) on the trimmed photoresist material 1170 and the substrate material 1172.

Figure 11D:
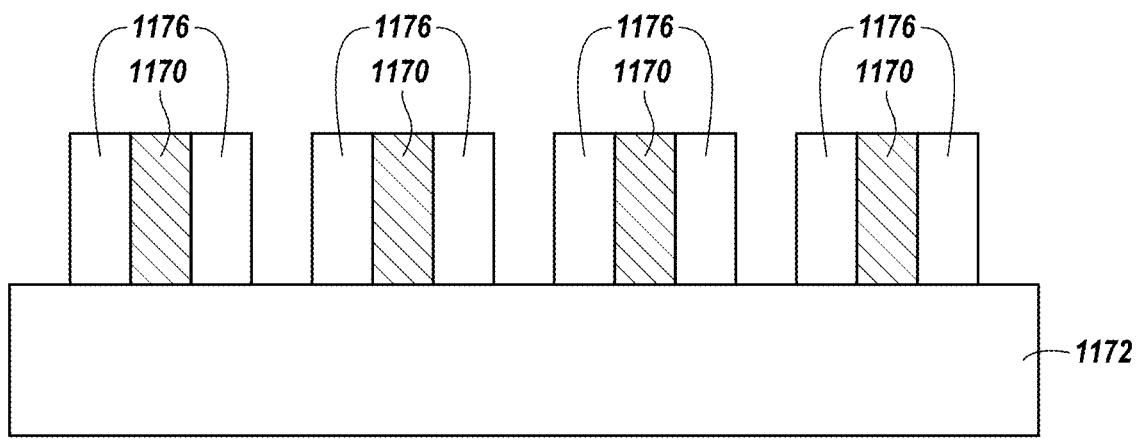

FIG. 11D illustrates the spacer material 1176 after a subsequent processing step in which a portion of the spacer material 1176 is removed (e.g., etched). The spacer material 1176 can be removed from the top of the trimmed photoresist material 1170. For example, as illustrated in FIG. 11 D, the top of the trimmed photoresist material 1170 can be coplanar with the tops of the adjacent spacer material 1176.

Figure 11E:
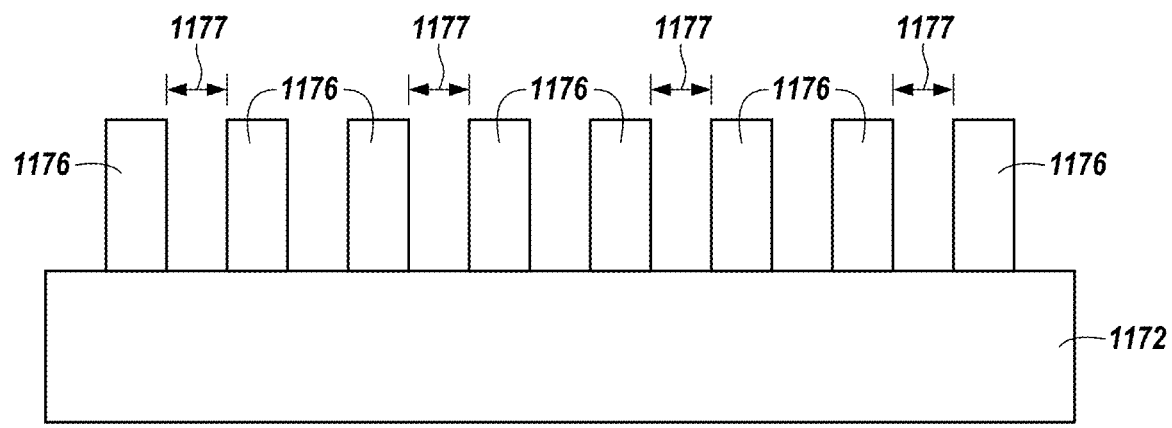

FIG. 11E illustrates the spacer material 1176 after a subsequent processing step in which the photoresist material 1170 is removed. As a result, each instance of the spacer material 1176 is separated from another instance of the spacer material 1176 by a second distance (e.g., a second pitch) 1177. The second distance 1177 can be half the first distance 1174.

FIG. 12 is a flow diagram of an example method 1280 for determining overlay of features of a memory array in accordance with a number of embodiments of the present disclosure. Unless explicitly stated, elements of methods described herein are not constrained to a particular order or sequence. Additionally, a number of the method embodiments, or elements thereof, described herein may be performed at the same, or at substantially the same, point in time.

At block 1281, the method 1280 can include forming a plurality of contacts on a working surface.

At block 1282, the method 1280 can include selectively forming a first portion of a layer of conductive lines and a second portion of the layer of conductive lines in contact with the contacts. The first portion of the layer of conductive lines formed over the working surface can be separated from the second portion of the layer of conductive lines formed over the working surface by a gap. Selectively forming the first and second portions of the layer of conductive lines can include applying a chop mask to the first and second portions of the layer of conductive lines.

At block 1283, the method 1280 can include determining an overlay of at least one of the contacts formed over the working surface in the gap relative to one of the conductive lines formed over the working surface. Determining the overlay of the at least one of the contacts can include determining an offset between the at least one of the contacts and one of the conductive lines formed over the working surface that is in line with the contact.

Forming the plurality of contacts can include selectively forming a first portion of a layer of contacts on the working surface and a second portion of the layer of contacts on the working surface. The first portion of the layer of contacts can be formed over the working surface in the gap. The second portion of the layer of conductive lines can be formed in another gap that separates the first portion of the layer of contacts formed over the working surface from the second portion of the layer of contacts formed over the working surface. The method 1280 can, in a number of embodiments, further include, determining an overlay of at least one of the contacts formed over the working surface in the gap relative to a conductive line that is formed over the working surface in the other gap. The method 1280 can, in a number of embodiments, further include, determining an overlay of at least one of the contacts formed over the working surface in the gap relative to a conductive line that is formed over the working surface in the other gap and in line with the contact formed in the gap.

FIG. 13 is a flow diagram of an example method 1384 for determining overlay of features of a memory array in accordance with a number of embodiments of the present disclosure. Unless explicitly stated, elements of methods described herein are not constrained to a particular order or sequence. Additionally, a number of the method embodiments, or elements thereof, described herein may be performed at the same, or at substantially the same, point in time.

At block 1385, the method 1384 can include selectively forming a first portion of a layer of contacts and a second portion of the layer of contacts on a working surface. The first portion of the layer of contacts formed over the working surface is separated from the second portion of the layer of contacts formed over the working surface by a gap.

At block 1386, the method 1384 can include selectively forming a first portion of a layer of conductive lines in contact with the first and second portions of the layer of contacts formed over the working surface and a second portion of the layer of conductive lines on the working surface. Selectively forming the first and second portions of the layer of conductive lines can include applying a chop mask to the first and second portions of the layer of conductive lines.

At block 1387, the method 1384 can include determining an overlay of at least one of the conductive lines formed over the working surface in the gap relative to one of the contacts formed over the working surface. Determining the overlay of the at least one of the conductive lines can include determining an offset between the at least one of the conductive lines relative to one of the contacts formed over the working surface that is in line with the conductive line.

Figure 14:
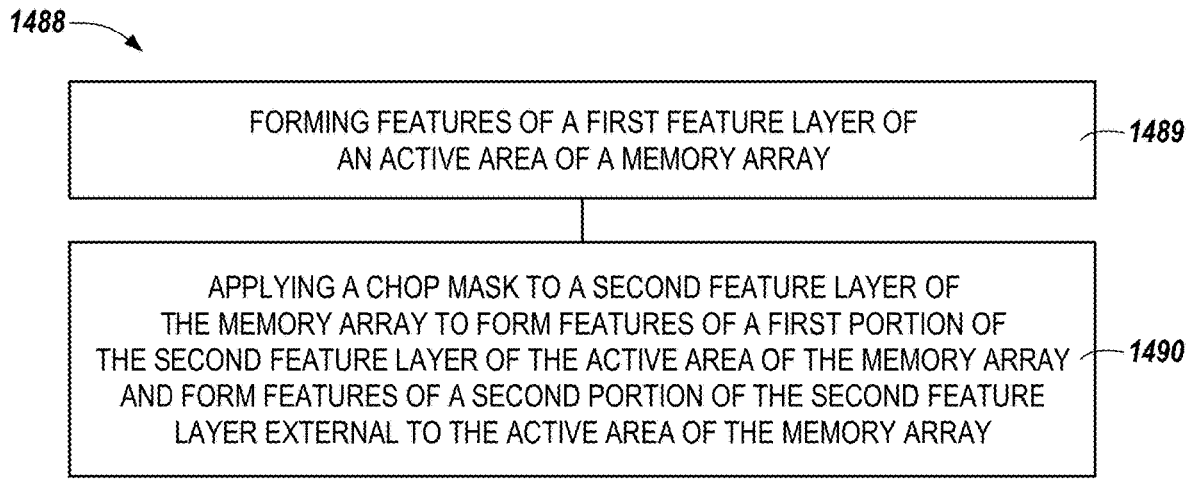

FIG. 14 is a flow diagram of an example method 1488 for determining overlay of features of a memory array in accordance with a number of embodiments of the present disclosure. Unless explicitly stated, elements of methods described herein are not constrained to a particular order or sequence. Additionally, a number of the method embodiments, or elements thereof, described herein may be performed at the same, or at substantially the same, point in time.

At block 1489, the method 1488 can include forming features of a first feature layer of an active area of a memory array.

At block 1490, the method 1488 can include applying a chop mask to a second feature layer of the memory array to form features of a first portion of the second feature layer of the active area of the memory array and form features of a second portion of the second feature layer external to the active area of the memory array.

The method 1488 can, in a number of embodiments, further include, determining an overlay of one of the formed features of the first feature layer of the active area relative to one of the formed features of the second portion of the second feature layer external to the active area of the memory array.

The method 1488 can, in a number of embodiments, further include, orienting features of the second portion of the second feature layer to be colinear with features of the first feature layer. Orienting the features of the second portion of the second feature layer can include rotating the features of the second portion of the second feature layer based on translation of the features of the second portion of the second feature layer relative to the features of the first feature layer. The translation of the features can include a horizontal (e.g., an x-direction) component and/or a vertical (e.g., an y-direction) component.

The method 1488 can, in a number of embodiments, further include, prior to forming the features of the first feature layer, forming a photoresist material on the working surface having a first pitch and trimming the photoresist material. A spacer material can be formed over the trimmed photoresist material. A portion of the spacer material in contact with a top surface of the trimmed photoresist material can be removed. The trimmed photoresist material can be removed so that the spacer material has a second pitch that is approximately half the first pitch.

Figure 15:
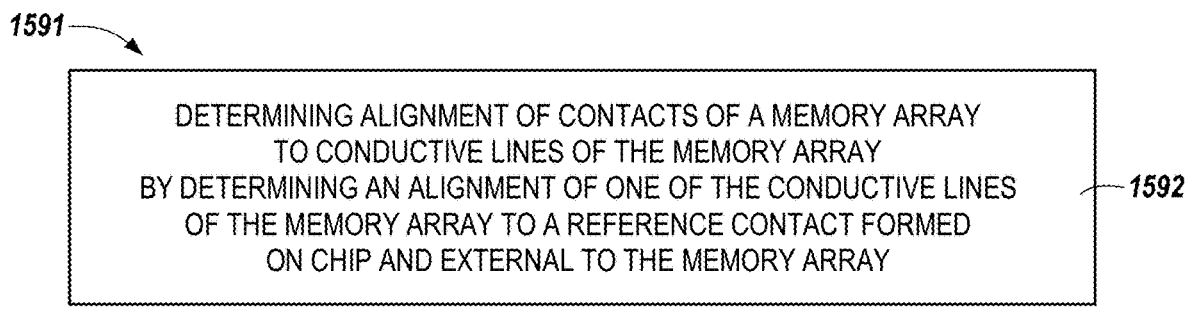

FIG. 15 is a flow diagram of an example method 1591 for determining overlay of features of a memory array in accordance with a number of embodiments of the present disclosure. Unless explicitly stated, elements of methods described herein are not constrained to a particular order or sequence. Additionally, a number of the method embodiments, or elements thereof, described herein may be performed at the same, or at substantially the same, point in time.

At block 1592, the method 1591 can include determining overlay of contacts of a memory array to conductive lines of the memory array by determining an overlay of one of the conductive lines of the memory array to a reference contact formed over chip and external to the memory array.

The method 1591 can, in a number of embodiments, further include, prior to determining the overlay, forming the contacts of the memory array on a working surface and forming the reference contact on a portion of the working surface that is external to an active region of the memory array. The method 1591 can further include extending a region of application of a chop mask to a contact layer to form the contacts and the reference contact concurrently.

In the above detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

It is to be understood that the terminology used herein is for the purpose of describing particular embodiments only and is not intended to be limiting. As used herein, the singular forms "a", "an", and "the" include singular and plural referents, unless the context clearly dictates otherwise, as do "a number of", "at least one", and "one or more" (e.g., a number of memory arrays may refer to one or more memory arrays), whereas a "plurality of" is intended to refer to more than one of such things. Furthermore, the words "can" and "may" are used throughout this application in a permissive sense (i.e., having the potential to, being able to), not in a mandatory sense (i.e., must). The term "include," and derivations thereof, means "including, but not limited to". The terms "coupled" and "coupling" mean to be directly or indirectly connected physically and, unless stated otherwise, can include a wireless connection for access to and/or for movement (transmission) of instructions (e.g., control signals, address signals, etc.) and data, as appropriate to the context.

While example embodiments including various combinations and configurations of semiconductor materials, underlying materials, structural materials, dielectric materials, capacitor materials, substrate materials, silicate materials, nitride materials, buffer materials, etch chemistries, etch processes, solvents, memory devices, memory cells, sidewalls of openings and/or trenches, among other materials and/or components related to determining overlay of features of a memory array, have been illustrated and described herein, embodiments of the present disclosure are not limited to those combinations explicitly recited herein. Other combinations and configurations of the semiconductor materials, underlying materials, structural materials, dielectric materials, capacitor materials, substrate materials, silicate materials, nitride materials, buffer materials, etch chemistries, etch processes, solvents, memory devices, memory cells, sidewalls of openings and/or trenches related to determining overlay of features of a memory array than those disclosed herein are expressly included within the scope of this disclosure.

Although specific embodiments have been illustrated and described herein, those of ordinary skill in the art will appreciate that an arrangement calculated to achieve the same results may be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method, comprising:
   forming a plurality of contacts on a working surface;
   selectively forming a first portion of a layer of conductive lines and a second portion of the layer of conductive lines in contact with the contacts,
   wherein the first portion of the layer of conductive lines formed over the working surface is separated from the second portion of the layer of conductive lines formed over the working surface by a gap; and
   determining an overlay of at least one of the contacts formed over the working surface in the gap relative to one of the conductive lines formed over the working surface,
   wherein forming the plurality of contacts comprises selectively forming a first portion of a layer of contacts on the working surface and a second portion of the layer of contacts on the working surface such that:
   the first portion of the layer of contacts is formed over the working surface in the gap; and
   the second portion of the layer of conductive lines is formed in another gap that separates the first portion of the layer of contacts formed over the working surface from the second portion of the layer of contacts formed over the working surface.

2. The method of claim 1, wherein selectively forming the first and second portions of the layer of conductive lines comprises applying a chop mask to the first and second portions of the layer of conductive lines.

3. The method of claim 1, wherein determining the overlay of the at least one of the contacts comprises determining an offset between the at least one of the contacts and one of the conductive lines formed over the working surface that is in line with the contact.

4. The method of claim 1, further comprising determining an overlay of at least one of the contacts formed over the working surface in the gap relative to a conductive line that is formed over the working surface in the other gap.

5. The method of claim 1, further comprising determining an overlay of at least one of the contacts formed over the working surface in the gap relative to a conductive line that is formed over the working surface in the other gap and in line with the contact formed in the gap.

6. A method, comprising:
   selectively forming, during a first fabrication operation, a first portion of a layer of contacts and a second portion of the layer of contacts on a working surface,
   wherein the first portion of the layer of contacts formed over the working surface is separated from the second portion of the layer of contacts formed over the working surface by a gap, and
   wherein the first portion or the second portion of the layer of contacts includes active contacts and reference contacts;
   selectively forming a first portion of a layer of active conductive lines in contact with the first and second portions of the layer of contacts formed over the working surface and a second portion of the layer of active conductive lines on the working surface; and
   determining a first overlay of at least one of the active conductive lines formed over the working surface in the gap relative to one of the reference contacts formed over the working surface,
   wherein the first overlay is indicative of a second overlay of a different one of the active conductive lines relative to at least one of the active contacts.

7. The method of claim 6, wherein selectively forming the first and second portions of the layer of active conductive lines comprises applying a chop mask to the first and second portions of the layer of active conductive lines.

8. The method of claim 6, wherein determining the first overlay comprises determining an offset between the at least one of the active conductive lines relative to one of the reference contacts that is in line with the active conductive line.

9. A method, comprising:
   forming features of a first feature layer of an active area of a memory array;
   applying a chop mask to a second feature layer of the memory array to:
   form features of a first portion of the second feature layer of the active area of the memory array; and
   form features of a second portion of the second feature layer external to the active area of the memory array; and orienting features of the second portion of the second feature layer to be colinear with features of the first feature layer, wherein orienting the features comprises rotating the features of the second portion of the second feature layer based on translation of the features of the second portion of the second feature layer relative to the features of the first feature layer.

10. The method of claim 9, further comprising determining an overlay of one of the formed features of the first feature layer of the active area relative to one of the formed features of the second portion of the second feature layer external to the active area of the memory array.

11. The method of claim 9, further comprising, prior to forming the features of the first feature layer:

forming a photoresist material on the working surface having a first pitch;

trimming the photoresist material;

forming a spacer material on the trimmed photoresist material;

removing a portion of the spacer material in contact with a top surface of the trimmed photoresist material; and removing the trimmed photoresist material so that the spacer material has a second pitch that is approximately half the first pitch.

12. A method, comprising:

forming, on chip and during a single semiconductor processing operation, active contacts of a memory array and a reference contact external to the memory array; and determining an overlay of an active conductive line of the memory array relative to the reference contact, wherein the determined overlay is indicative of an overlay of the active contacts relative to the active conductive line.

13. The method of claim 12, further comprising, prior to determining the overlay, forming the reference contact on a portion of the working surface that is external to an active region of the memory array.

14. The method of claim 12, wherein forming the active contacts of the memory array and the reference contact comprises extending a region of application of a chop mask to a layer of contacts to form the active contacts of the memory array and the reference contact concurrently.

15. A method, comprising:

forming, during a first semiconductor processing operation, a plurality of contacts on a working surface, wherein the plurality of contacts includes active contacts and reference contacts;

selectively forming, during a second semiconductor processing operation, a first portion of a layer of active conductive lines over the working surface and a second portion of the layer of active conductive lines over the working surface and in contact with the contacts, wherein the first portion of the layer of active conductive lines is separated from the second portion of the layer of conductive lines by a gap; and determining a first overlay of at least one of the reference contacts formed in the gap relative to one of the active conductive lines, wherein the first overlay is indicative of a second overlay of at least one of the active contacts relative to a different one of the active conductive lines.

16. The method of claim 15, wherein selectively forming the first and second portions of the layer of active conductive lines comprises applying a chop mask to the first and second portions of the layer of active conductive lines.

17. The method of claim 15, wherein determining the overlay of the at least one of the reference contacts comprises determining an offset between the at least one of the reference contacts and one of the active conductive lines that is in line with the reference contact.

* * * * *